United States Patent
Chou

(10) Patent No.: US 11,956,891 B2
(45) Date of Patent: Apr. 9, 2024

(54) ELECTRONIC MODULE

(71) Applicant: Chicony Electronics Co., Ltd., New Taipei (TW)

(72) Inventor: Sheng-Sung Chou, New Taipei (TW)

(73) Assignee: Chicony Electronics Co., Ltd., New Taipei (TW)

( * ) Notice: Subject to any disclaimer, the term of this patent is extended or adjusted under 35 U.S.C. 154(b) by 224 days.

(21) Appl. No.: 17/367,423

(22) Filed: Jul. 5, 2021

(65) Prior Publication Data

US 2022/0330421 A1  Oct. 13, 2022

(30) Foreign Application Priority Data

Apr. 13, 2021 (TW) ................. 110113280

(51) Int. Cl.
*H05K 1/00* (2006.01)
*H04N 23/57* (2023.01)
*H05K 1/02* (2006.01)

(52) U.S. Cl.
CPC ........... *H05K 1/0271* (2013.01); *H04N 23/57* (2023.01); *H05K 1/0215* (2013.01)

(58) Field of Classification Search
CPC ..... H05K 1/0271; H05K 1/0215; H04N 23/57
See application file for complete search history.

(56) References Cited

U.S. PATENT DOCUMENTS 9,504,177 B2 * 11/2016 Shah ................... H05K 5/0247
9,536,798 B2 *  1/2017 Lu ..................... H01L 23/49575
2017/0318713 A1 * 11/2017 Bang ................... H05K 9/0083

FOREIGN PATENT DOCUMENTS

TW  201041110  11/2010

OTHER PUBLICATIONS

CN104752597 A English Translation (Year: 2015).*
CN 101123195 A1; English Translation (Year: 2008).*
CN 101123195 A1; English Translation (Year: 2015).*
JP 06190833 A published 1994 (Year: 1994).*
CN104752597 A English Translation (Year: 2008).*
"Office Action of Taiwan Counterpart Application", dated Feb. 9, 2022, p. 1-p. 6.

* cited by examiner

*Primary Examiner* — Pete T Lee
(74) *Attorney, Agent, or Firm* — JCIPRNET

(57) ABSTRACT

An electronic module is provided, including a circuit board, at least one electronic component, a covering layer, and an adhesive. The at least one electronic component is disposed on the circuit board. The covering layer has multiple holes, and the covering layer is disposed on the circuit board and covers the at least one electronic component. The adhesive is combined to the covering layer, and the adhesive fills the holes and encapsulates the at least one electronic component.

9 Claims, 4 Drawing Sheets

ELECTRONIC MODULE

CROSS-REFERENCE TO RELATED APPLICATION

This application claims the priority benefit of Taiwan application serial no. 110113280, filed on Apr. 13, 2021. The entirety of the above-mentioned patent application is hereby incorporated by reference herein and made a part of this specification.

BACKGROUND

Technical Field

The disclosure relates to an electronic module, and more particularly to an electronic module including a covering layer.

Description of Related Art

In existing personal computer camera modules (notebook cameras), electronic components are disposed on a thin circuit board. Due to poor bending resistance of the thin circuit board, the thin circuit board may be bent by an external force when assembled by an operator, and the electronic components disposed thereon may thus be damaged. In addition, the thin circuit board may be affected by electromagnetic waves or static electricity generated by the electronic components or from surroundings. Therefore, there is a need to shield the electronic components.

In order to solve the above problems, conventionally, a metal shell is disposed on the thin circuit board to cover the electronic components. The metal shell can improve bending resistance of the thin circuit board and provide a good shielding effect. However, since the size and shape of the metal shell are difficult to change, electronic modules of various sizes and shapes are required to be customized, which results in low processing efficiency and poor flexibility in manufacturing. In addition, if there is a need for rework, the circuit board and the electronic components are likely to be damaged during removal of the metal shell, which leads to low rework efficiency and yield.

SUMMARY

The disclosure provides an electronic module having good bending resistance and a good shielding effect.

The electronic module of the disclosure includes a circuit board, at least one electronic component, a covering layer, and an adhesive. The covering layer may be a mesh structure including a back adhesive. The at least one electronic component is disposed on the circuit board. The covering layer has multiple holes, and is disposed on the circuit board and attached to the at least one electronic component for covering the at least one electronic component. The adhesive is combined between upper and lower edges of the covering layer and the at least one electronic component, and the adhesive fills the holes and encapsulates the at least one electronic component.

In an embodiment of the disclosure, the covering layer is a mesh structure.

In an embodiment of the disclosure, a material of the covering layer is an insulating material.

In an embodiment of the disclosure, the electronic module further includes a back adhesive, and the back adhesive is glued between the circuit board and the covering layer.

In an embodiment of the disclosure, the electronic module further includes a conductive layer, and the conductive layer encapsulates the covering layer and the adhesive.

In an embodiment of the disclosure, the circuit board has a ground portion, and the conductive layer contacts the ground portion.

In an embodiment of the disclosure, the electronic module further includes an insulating layer, and the insulating layer is located between the adhesive and the conductive layer.

In an embodiment of the disclosure, the electronic module further includes a functional component, the functional component is disposed on the circuit board, the covering layer has an opening, and the opening exposes the functional component.

In an embodiment of the disclosure, the functional component is a light-emitting component, an indicator light component, or a microphone component.

In an embodiment of the disclosure, the adhesive is a light-curing adhesive, a heat-curing adhesive, or a room-temperature curing adhesive, but the disclosure is not limited thereto.

Based on the above, in the electronic module of the disclosure, the covering layer having multiple holes is disposed on the circuit board and covers the electronic component. The adhesive is combined to the covering layer, and the adhesive fills the holes and encapsulates the electronic component. In this way, the covering layer and the adhesive may effectively improve bending resistance of the circuit board to avoid the electronic component disposed on the circuit board from being damaged. In addition, since the covering layer is easy to cut, the size and shape of the covering layer may be simply changed according to actual needs. Therefore, the electronic module has high manufacturing efficiency and good flexibility. In addition, a formula ratio of the adhesive may be selectively adjusted according to design or process needs for adhering the adhesive between the covering layer and the electronic component, so that the adhesive may be easily removed along with the covering layer during rework. In this way, the electronic module has good rework efficiency and yield.

In order to make the aforementioned features and advantages of the disclosure comprehensible, embodiments accompanied with drawings are described in detail below.

DESCRIPTION OF THE EMBODIMENTS

Figure 1:
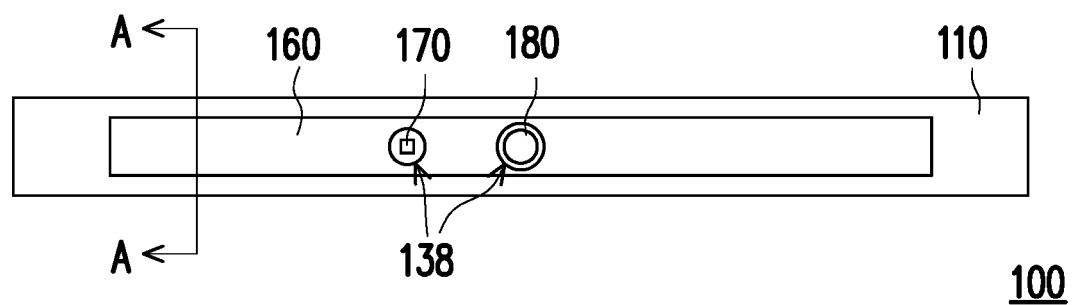
FIG. 1 is a front view of an electronic module according to an embodiment of the disclosure.
Figure 2:
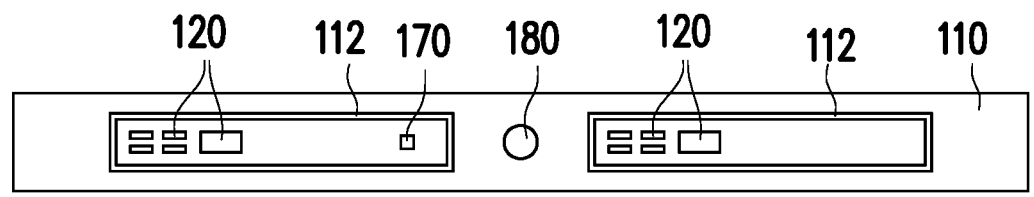
FIG. 2 illustrates a partial structure of the electronic module of FIG. 1.

FIG. 1 is a front view of an electronic module according to an embodiment of the disclosure. FIG. 2 illustrates a partial structure of the electronic module of FIG. 1. With reference to FIG. 1 and FIG. 2, an electronic module 100 of this embodiment is, for example, a personal computer camera module (a notebook camera), including a circuit board 110, a lens 180, a functional component 170 related to camera functions, and at least one electronic component 120 (shown as multiple electronic components 120 in FIG. 2). The electronic component 120 is disposed on the circuit board 110. The functional component 170 is, for example, a light-emitting component, an indicator light component, or a microphone component. The light-emitting component is, for example, an infrared light-emitting diode (LED) configured to fill light in an environment with low illumination or even without any light source. The indicator light component is, for example, a white light LED configured to remind a user of a status of the electronic module 100. In other embodiments, the electronic module 100 may be in other forms and is not limited to certain forms.

Figure 3:
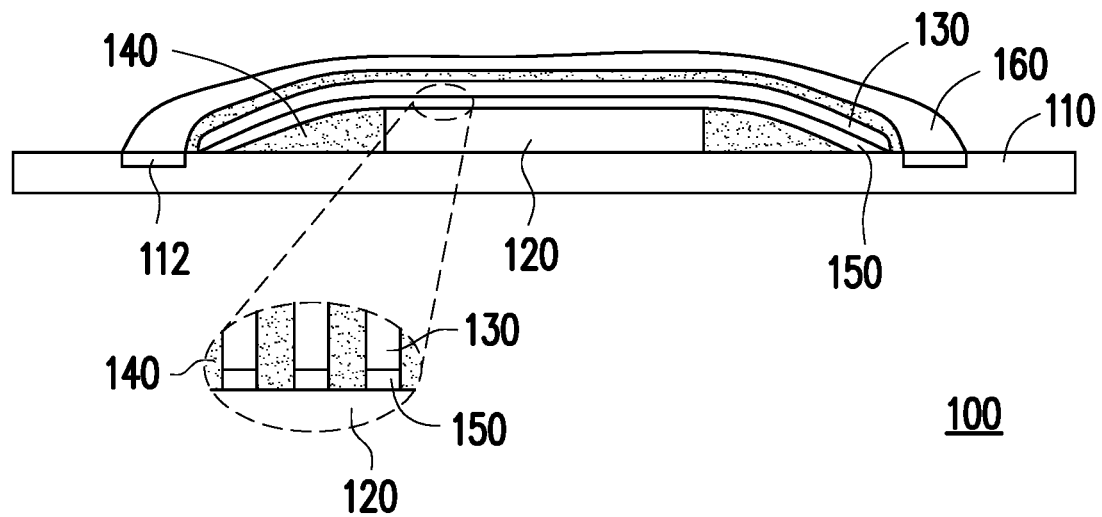
FIG. 3 is a cross-sectional view of the electronic module of FIG. 1 taken along a section line A-A.
Figure 4:
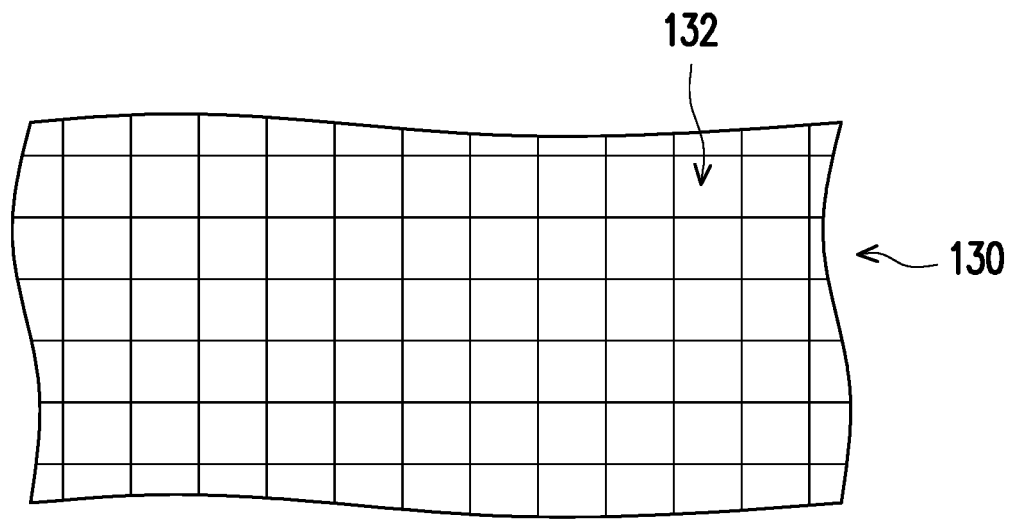
FIG. 4 is a partial schematic view of a covering layer of FIG. 1.

FIG. 3 is a cross-sectional view of the electronic module of FIG. 1 taken along a section line A-A. FIG. 4 is a partial schematic view of a covering layer of FIG. 1. With reference to FIG. 2 to FIG. 4, the electronic module 100 of this embodiment further includes a covering layer 130 and an adhesive 140. The covering layer 130 has multiple holes 132. The covering layer 130 is disposed on the circuit board 110 and covers the electronic component 120. The adhesive 140 is combined between upper and lower edges of the covering layer 130 and the electronic component 120. The adhesive 140 fills the holes 132 and encapsulates the electronic component 120.

In this way, the covering layer 130 and the adhesive 140 of this embodiment may effectively improve bending resistance of the circuit board 110 to avoid the electronic component 120 disposed on the circuit board 110 from being damaged. In addition, since the covering layer 130 is easy to cut, the size and shape of the covering layer 130 may be simply changed according to actual needs. In this way, the covering layer 130 may be manufactured by directly manufacturing a large area of the covering layer 130 and then cutting the large area according to actual needs. In other words, the covering layer 130 may be manufactured without being customized for various sizes and shapes of the electronic module 100. Therefore, the electronic module 100 of this embodiment has high manufacturing efficiency and good flexibility. In addition, since the covering layer 130 may be easily removed from the circuit board 110, the adhesive 140 adhered to the covering layer 130 may be easily removed from the circuit board 110 along with the covering layer 130 without damaging the circuit board 110 or the electronic component 120 during removal of the covering layer 130. In this way, the electronic module 100 of this embodiment has good rework efficiency to maintain yield after rework.

In this embodiment, the circuit board 110 is, for example, a thin printed circuit board (PCB). As shown in FIG. 1, in this embodiment, the covering layer 130 has an opening 138, and the opening 138 exposes the functional component 170 and the lens 180.

With reference to FIG. 4, in this embodiment, the covering layer 130 is a mesh structure, and the holes 132 are evenly distributed throughout the covering layer 130. In other embodiments, the covering layer 130 may be a structure having multiple holes 132 in other forms, and is not limited to certain forms. The density of the holes 132 may be adjusted according to actual needs. In addition, a material of the covering layer 130 is, for example, an insulating material, and the covering layer 130 with insulating properties may isolate the electronic component 120 to avoid short circuit problems. For example, the covering layer 130 may be a non-woven fabric, or the covering layer 130 may be made of polyvinyl chloride (PVC), but is not limited thereto.

In this embodiment, the adhesive 140 in a liquid state may infiltrate below the covering layer 130 through the holes 132. For example, the adhesive 140 may be a light-curing adhesive or heat-curing adhesive, or may be other types of adhesives, such as a room-temperature curing adhesive, a hybrid adhesive, a quick-drying adhesive, a resin, a silicone adhesive, an epoxy adhesive, an acrylic adhesive, etc. A formula combination of the adhesive 140 may be adjusted according to design and process needs, and the disclosure is not limited thereto. After the adhesive 140 fills a space between the opening 132, the covering layer 130, and the circuit board 110, the adhesive 140 may be cured by irradiating with ultraviolet light or heating, or may be cured after being left at room temperature for a period of time.

As shown in FIG. 2, in this embodiment, the circuit board 110 has a ground portion 112. A material of the grounding portion 112 is mostly a copper layer, a gold layer or a tin layer. The ground portion 112 exposed on a surface of the circuit board 110 is, for example, rectangular and surrounds the electronic component 120, but the disclosure is not limited thereto. Based on the above, as shown in FIG. 3, the electronic module 100 further includes a conductive layer 160, and the conductive layer 160 encapsulates the covering layer 130 and the adhesive 140. Specifically, the conductive layer 160 covers the covering layer 130 and the adhesive 140, and surrounds the covering layer 130 and the adhesive 140. The conductive layer 160 contacts the ground portion 112 from surroundings of the covering layer 130 and the adhesive 140. The conductive layer 160 may shield the electronic component 120, which is encapsulated, thereby avoiding the electronic component 120 from being affected by electromagnetic waves or static electricity from surroundings. In this embodiment, the conductive layer 160 is made of a material with conductive properties. For example, the conductive layer 160 may be made of a metal conductive paint or a conductive adhesive, and may be formed on the covering layer 130 and the adhesive 140 by spray coating. Alternatively, the conductive layer 160 may also be made of graphite, which has good thermal conductivity and may improve heat dissipation efficiency of the electronic module 100 to avoid the electronic component 120 from being damaged due to overheating.

A manufacturing flow of the electronic module 100 of this embodiment is described below.

Figure 5A:
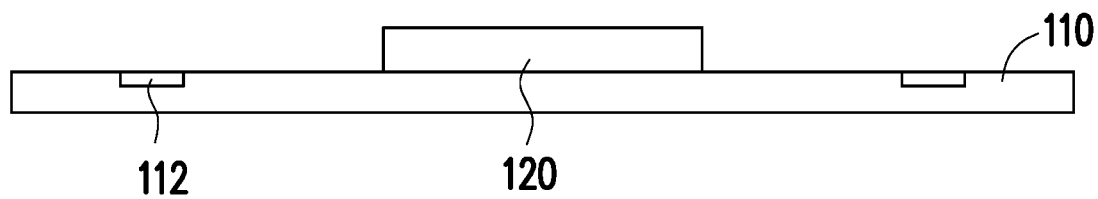
FIG. 5A to FIG. 5C are manufacturing flowcharts of the electronic module of FIG. 1.
Figure 5B:
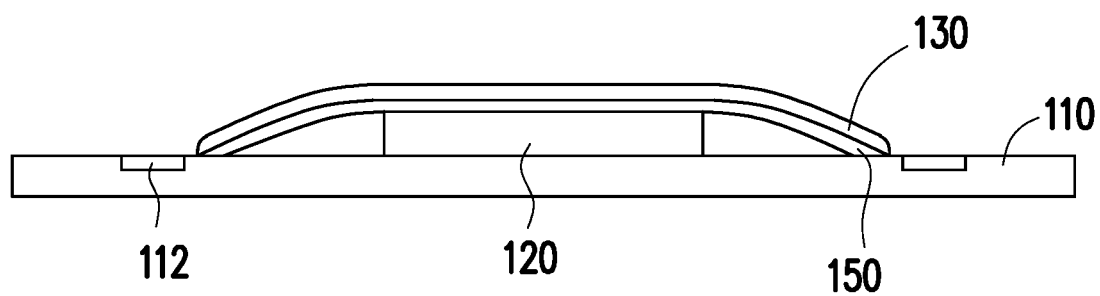
Figure 5C:
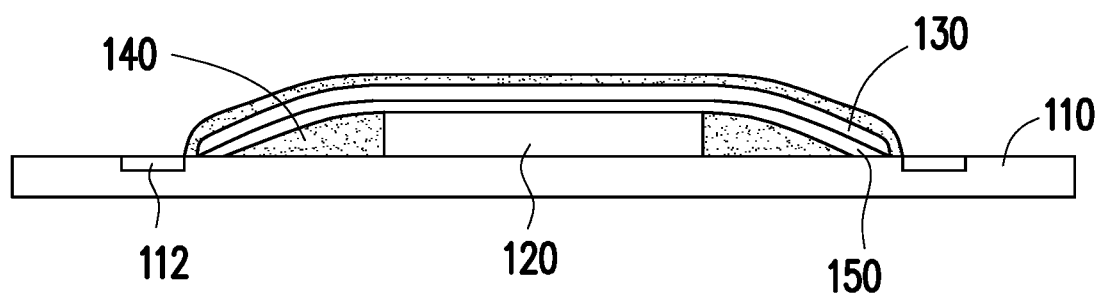

FIG. 5A to FIG. 5C are manufacturing flowcharts of the electronic module of FIG. 1. First, as shown in FIG. 5A, the circuit board 110 is provided, which has the ground portion 112, and the electronic component 120 is disposed on the circuit board 110. Next, as shown in FIG. 5B, the covering layer 130 is cut into the corresponding size and shape according to actual needs, and the covering layer 130 is disposed on the circuit board 110 to cover the electronic component 120. In this embodiment, a bottom of the covering layer 130 further includes a back adhesive 150 glued between the circuit board 110 and the covering layer 130. The back adhesive 150 has adhesiveness, and the back adhesive 150 may be disposed on the bottom of the covering layer 130 in advance. Therefore, the covering layer 130 may be pre-fixed by using the back adhesive 150 disposed on the bottom of the covering layer 130 in advance.

As shown in FIG. 5C, the adhesive 140 is spray-coated on the covering layer 130 by, for example, spray coating, and the adhesive 140 infiltrates below the covering layer 130 through the holes 132 of the covering layer 130 to encapsulate the electronic component 120. Next, by irradiating with ultraviolet light or heating, the adhesive 140 becomes a solid with good bending resistance. Finally, the conductive layer 160 is disposed on the covering layer 130 by, for example, spray coating, so that the conductive layer 160 encapsulates the upper and sides of the covering layer 130 and the adhesive 140, and contacts the ground portion 112 to complete the electronic module 100 shown in FIG. 3.

It should be noted that during spray coating, a mask (not shown) may be disposed at a position corresponding to the opening 138, so that the functional component 170 and the lens 180 in the opening 138 are not covered by the adhesive 140 or the conductive layer 160.

Figure 6:
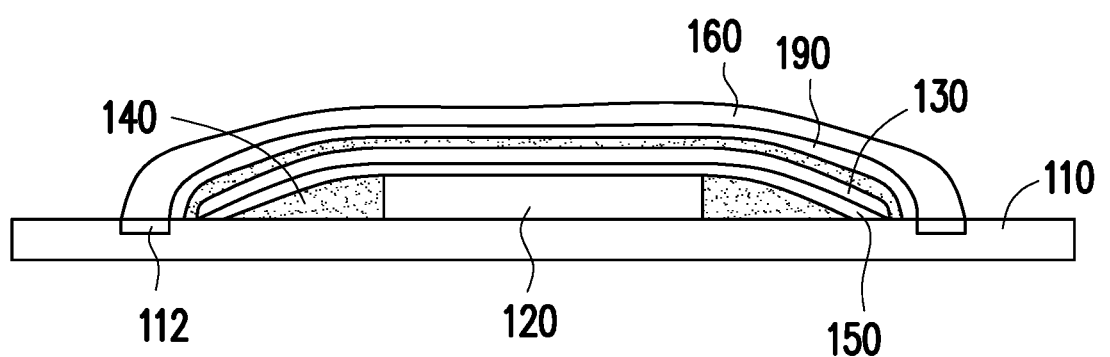
FIG. 6 is a cross-sectional view of an electronic module according to another embodiment of the disclosure.

FIG. 6 is a cross-sectional view of an electronic module according to another embodiment of the invention. With reference to FIG. 3 and FIG. 6, an electronic module 100A of this embodiment is similar to the electronic module 100 of FIG. 3. The difference between the two is that in this embodiment, the electronic module 100A further includes an insulating layer 190. The insulating layer 190 is located between the adhesive 140 and the conductive layer 160. In this way, the insulating layer 190 may further isolate the electronic component 120 from the conductive layer 160. Therefore, even if the adhesive 140 does not evenly encapsulate the electronic component 120, the electronic component 120 will not contact the conductive layer 160 and cause short circuit problems.

In summary, in the electronic module of the disclosure, the covering layer having multiple holes is disposed on the circuit board and covers the electronic component. The adhesive is combined to the covering layer, and the adhesive fills the holes and encapsulates the electronic component. In this way, the covering layer and the adhesive may effectively improve the bending resistance of the circuit board to avoid the electronic component disposed on the circuit board from being damaged. In addition, since the covering layer is easy to cut, the size and shape of the covering layer may be simply changed according to actual needs. Therefore, the electronic module has high manufacturing efficiency and good flexibility. Moreover, since the adhesive is adhered to the covering layer, the adhesive may be easily removed along with the covering layer during rework. In this way, the electronic module has good rework efficiency and yield. In addition, the conductive layer encapsulates the covering layer and the adhesive and contacts the ground portion, so that the conductive layer may shield the electronic component to avoid the electronic component from being affected by the electromagnetic waves or static electricity from surroundings.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. An electronic module, comprising:
a circuit board;
at least one electronic component, configured on the circuit board;
a covering layer, having a plurality of holes, wherein the covering layer is disposed on the circuit board and covers the at least one electronic component;
an adhesive, combined to the covering layer, wherein the adhesive fills the plurality of holes and encapsulates the at least one electronic component; and
a back adhesive, wherein the back adhesive is glued between the circuit board and the covering layer.

2. The electronic module according to claim 1, wherein the covering layer is a mesh structure.

3. The electronic module according to claim 1, wherein a material of the covering layer comprises an insulating material.

4. The electronic module according to claim 1, further comprising a conductive layer, wherein the conductive layer encapsulates the covering layer and the adhesive.

5. The electronic module according to claim 4, wherein the circuit board has a ground portion, and the conductive layer contacts the ground portion.

6. The electronic module according to claim 4, further comprising an insulating layer, wherein the insulating layer is located between the adhesive and the conductive layer.

7. The electronic module according to claim 1, further comprising a functional component, wherein the functional component is disposed on the circuit board, the covering layer has an opening, and the opening exposes the functional component.

8. The electronic module according to claim 7, wherein the functional component is a light-emitting component, an indicator light component, or a microphone component.

9. The electronic module according to claim 1, wherein the adhesive is a light-curing adhesive, a heat-curing adhesive, or a room-temperature curing adhesive.

* * * * *